(12) United States Patent
Cali et al.

(10) Patent No.: US 11,012,079 B1
(45) Date of Patent: May 18, 2021

(54) CONTINUOUS TUNING OF DIGITALLY SWITCHED VOLTAGE-CONTROLLED OSCILLATOR FREQUENCY BANDS

(71) Applicant: BAE Systems Information and Electronic Systems Integration Inc., Nashua, NH (US)

(72) Inventors: Joseph D. Cali, Nashua, NH (US); Curtis M. Grens, Manchester, NH (US); Richard L. Harwood, Westford, MA (US); Gary M. Madison, Waltham, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/721,494

(22) Filed: Dec. 19, 2019

(51) Int. Cl.
*H03L 7/099* (2006.01)
*H03L 7/107* (2006.01)
*H03L 7/093* (2006.01)

(52) U.S. Cl.
CPC .............. *H03L 7/099* (2013.01); *H03L 7/093* (2013.01); *H03L 7/107* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,625,325 A | * | 4/1997 | Rotzoll | H03L 7/0898 331/16 |
| 5,991,221 A | * | 11/1999 | Ishikawa | G11C 5/14 365/189.06 |
| 6,091,304 A | * | 7/2000 | Harrer | H03L 7/10 331/10 |
| 6,188,740 B1 | * | 2/2001 | Tomaru | H03L 7/1974 375/376 |
| 6,396,889 B1 | * | 5/2002 | Sunter | H03L 7/08 375/376 |
| 6,448,755 B1 | * | 9/2002 | Opsahl | H03L 7/085 324/621 |
| 6,583,675 B2 | * | 6/2003 | Gomez | H03D 7/165 331/17 |
| 7,948,325 B2 | | 5/2011 | Gomez | |

(Continued)

*Primary Examiner* — Adam D Houston
(74) *Attorney, Agent, or Firm* — Finch & Maloney PLLC; Scott J. Asmus

(57) ABSTRACT

A phase locked loop (PLL) control system includes a voltage-controlled oscillator (VCO) circuit including an inductor and a plurality of capacitors arranged in parallel with the inductor. Digitally enabling or disabling the capacitors in a thermometer coded manner via switches creates tuning states that provide additional frequency range, and each has a limited range of VCO frequency tuning. Slowly ramping the switched capacitance, by implementing the capacitor as a varactor, from one thermal code to the next, provides a wider continuous VCO frequency tuning range for use in the PLL. The slow transition between tuning states allows the PLL to remain in lock, useful under changing operating conditions. Specifically, under changing operating conditions, digital logic detects the PLL tuning control voltage approaching the edge of a VCO band and will add/reduce VCO capacitance effectively transitioning into the adjacent VCO band while the PLL maintains lock via its normal feedback loop.

17 Claims, 8 Drawing Sheets

(56) References Cited

U.S. PATENT DOCUMENTS

| | | | |
|---|---|---|---|
| 2002/0011885 A1* | 1/2002 | Ogawa | G06F 30/367 327/158 |
| 2002/0011902 A1* | 1/2002 | Ipek | H03L 7/0995 331/17 |
| 2002/0041214 A1* | 4/2002 | Ichimura | H03L 7/1072 331/14 |
| 2005/0094472 A1* | 5/2005 | Ishikawa | G11C 5/145 365/226 |
| 2005/0156917 A1* | 7/2005 | Tobita | G09G 3/3283 345/204 |
| 2008/0246521 A1* | 10/2008 | Feng | H03L 7/1974 327/159 |
| 2009/0066431 A1* | 3/2009 | Shin | H03B 5/1852 331/117 FE |
| 2009/0096497 A1* | 4/2009 | Feng | H03L 7/1974 327/156 |
| 2010/0097110 A1* | 4/2010 | Kearney | H03C 3/0925 327/156 |
| 2011/0140738 A1* | 6/2011 | Mallinson | H03L 7/093 327/16 |
| 2017/0365414 A1* | 12/2017 | Tanaka | H03M 1/1061 |
| 2018/0075796 A1* | 3/2018 | Hayashi | G09G 3/2018 |
| 2018/0097475 A1* | 4/2018 | Djahanshahi | H03B 27/00 |
| 2018/0261150 A1* | 9/2018 | Tamura | G09G 3/20 |
| 2019/0073940 A1* | 3/2019 | Morita | H03F 3/45475 |
| 2019/0088229 A1* | 3/2019 | Morita | G09G 3/20 |
| 2019/0147789 A1* | 5/2019 | Morita | G09G 3/20 345/690 |
| 2019/0165731 A1* | 5/2019 | Yildirim | H03L 7/099 |
| 2020/0027384 A1* | 1/2020 | Morita | G09G 3/20 |
| 2020/0184916 A1* | 6/2020 | Morita | H03F 3/45071 |
| 2020/0184917 A1* | 6/2020 | Morita | G09G 3/3614 |

* cited by examiner

CONTINUOUS TUNING OF DIGITALLY SWITCHED VOLTAGE-CONTROLLED OSCILLATOR FREQUENCY BANDS

STATEMENT OF GOVERNMENT INTEREST

This invention was made with United States Government assistance under Contract No. HR0011-17-C awarded by DARPA. The United States Government has certain rights in this invention.

FIELD OF THE DISCLOSURE

This disclosure relates generally to the field of electronics, and more particularly, to techniques for continuous tuning of digitally switched voltage-controlled oscillator (VCO) frequency bands in a phase locked loop (PLL) control system.

BACKGROUND

A voltage-controlled oscillator (VCO) is an electronic circuit that produces a periodic, oscillating electronic signal, such as a sine wave or a square wave. The oscillation frequency of a VCO is controlled by a direct current (DC) tuning control voltage input. When a VCO is used in a PLL control system, the tuning control voltage input of the VCO can be varied to provide the desired output phase and frequency of the VCO. However, the output phase of the VCO has a tendency to drift away from the desired phase, necessitating a compensatory adjustment to the tuning control voltage. In this scenario, the PLL control system includes a phase detector that compares the phase of the PLL's divided VCO output with the phase of the PLL reference input and adjusts the VCO to keep the input and output phases in lock step (within a threshold number of degrees of each other). Non-trivial issues associated with maintaining a phase locked loop signal remain due to the limitations of existing designs, particularly with respect to PLL systems subjected to varying environmental factors (e.g., temperature).

DETAILED DESCRIPTION

Figure 1:
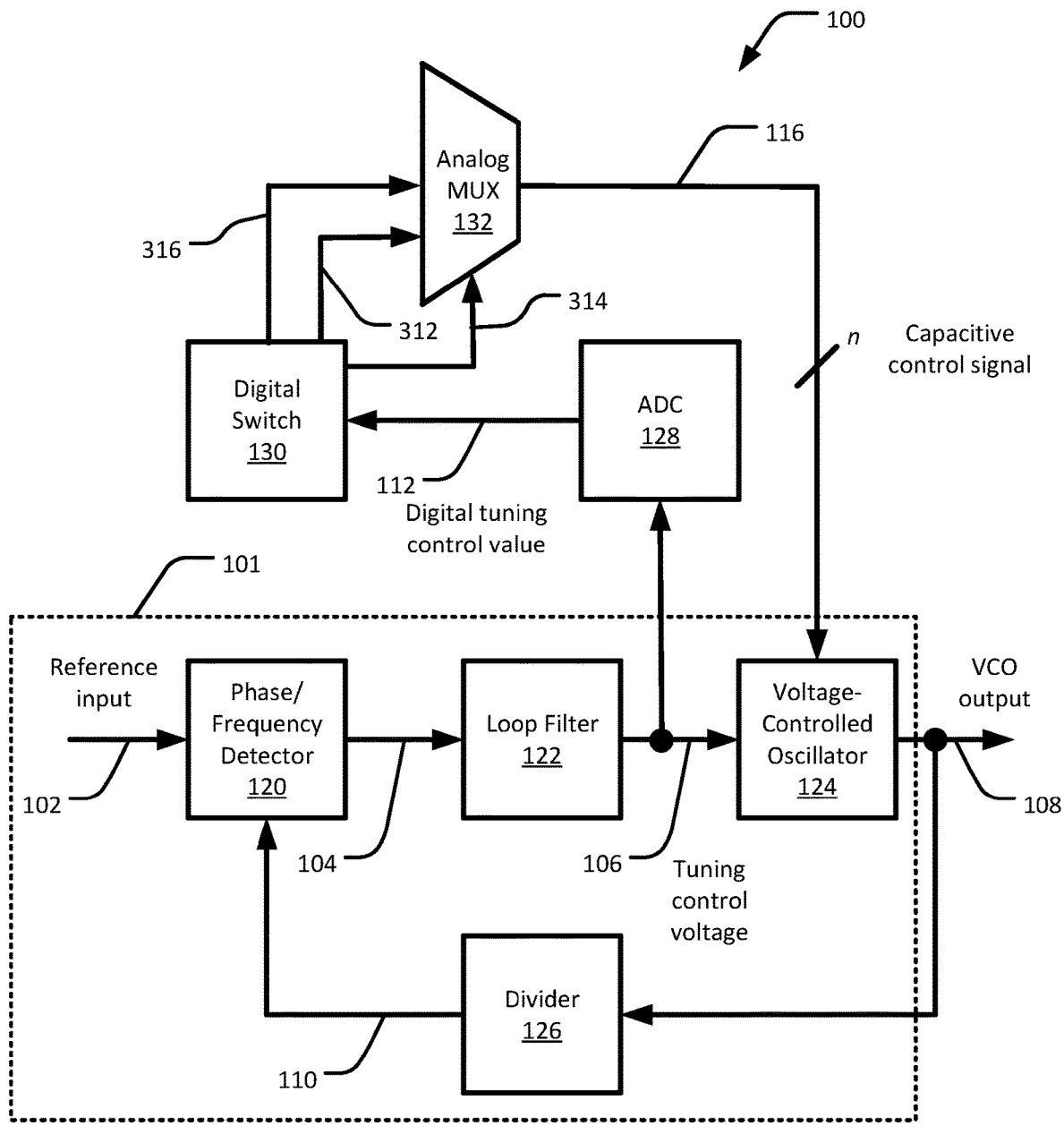
FIG. 1 is a block diagram of an example system for continuous tuning of digitally switched VCO frequency bands, in accordance with an embodiment of the present disclosure.

A phase locked loop (PLL) control system includes a voltage-controlled oscillator (VCO) circuit including an inductor and a plurality of capacitors arranged in parallel with the inductor. Digitally enabling or disabling the capacitors in a thermometer coded manner via switches creates tuning states that provide additional frequency range, and each has a limited range of VCO frequency tuning. Slowly ramping the switched capacitance, by implementing the capacitor as a varactor, from one thermal code to the next, provides a wider continuous VCO frequency tuning range for use in the PLL. The slow transition between tuning states allows the PLL to remain in lock, useful under changing operating conditions. Specifically, under changing operating conditions, digital logic detects the PLL tuning control voltage approaching the edge of a VCO band and will add/reduce VCO capacitance effectively transitioning into the adjacent VCO band while the PLL maintains lock via its normal feedback loop. Using overlapping VCO bandwidth for each tuning state allows a guard banded seamless transition from one tuning state to the next while allowing the VCO or operate closer to the center of VCO's tuning state's bandwidth.

In more detail, techniques are disclosed for continuous tuning of digitally switched voltage-controlled oscillator frequency bands. The techniques are particularly well-suited for phase locked loop applications and for other VCO applications. In accordance with an embodiment of the present disclosure, a VCO of a PLL system includes digital switching logic configured to maintain frequency lock as the output crosses a frequency band boundary by gradually switching between discrete frequency bands. The digital switching logic, also referred to as a digital switch or a soft switch, effectively monitors the VCO input tuning control voltage to detect a change or a drift in the VCO output frequency caused by a change in temperature or another operating condition. When the VCO output frequency drifts beyond the range of the currently selected tuning state, the digital switching logic performs a gradual transition to the next tuning state, allowing the PLL system to remain phase locked throughout the transition. For example, instead of an abrupt and discrete switch from 2 capacitors to 3 capacitors in parallel with the inductor in the voltage-controlled oscillator, the digital switching logic instead gradually ramps the DC capacitance control signal in small, intermediate steps from a starting state to the final state on the third capacitor while the first two capacitors capacitance control signals remain constant. The phase locked loop will track the VCO's oscillation change due to the slow frequency/phase transition and will adjust the tuning control voltage to remain in lock while the PLL enters the adjacent voltage-controlled oscillator frequency band.

General Overview

As previously noted, there are a number of non-trivial issues associated with maintaining a phase locked loop signal, particularly with respect to PLL systems subjected to varying environmental factors (e.g., temperature). In more detail, voltage-controlled oscillators (VCOs) used in phase locked loop (PLL) frequency synthesizers often include digitally-controlled coarse tuning states to increase the tuning range of the synthesizer across multiple discrete bands. However, if temperature or other environmental factors cause the frequency to drift across the boundary of one of these bands, then the PLL system will lose frequency lock, which is undesirable. For instance, if temperature or environmental factors cause the PLL system to lose lock, then regaining lock can require up to tens or hundreds of microseconds, or more, which can result in system downtime. Increasing the analog voltage range will lower the required VCO gain and subsequent phase noise, which is desirable. However, for reliability reasons, there is a practical limit to the voltage range. By contrast, increasing the frequency range for a given voltage range to remove tuning boundaries will increase VCO gain and phase noise.

To this end, techniques are provided herein that allow a PLL system to maintain frequency lock across tuning boundaries by gradually switching between otherwise discrete frequency bands. For instance, a PLL system according to an example embodiment provides a smooth crossing of a discrete tuning boundary by soft-switching between otherwise discrete frequency states using a continuous analog control signal. The frequency states can be provided, for example, by a bank of switched capacitors. In one such embodiment, when a digital switching logic senses the tuning control voltage for the VCO is near its tuning limit, a multiplexer routes a delta-sigma modulator (DSM)-generated analog signal onto a desired thermometer-coded capacitor switch. This switch provides soft-switching and allows the VCO capacitance control signal to be slowly ramped to maintain phase lock while switching from one frequency band state to another.

System Architecture

FIG. 1 is a block diagram of an example system 100 for continuous tuning of digitally switched VCO frequency bands in a PLL control system, in accordance with an embodiment of the present disclosure. The system 100 includes a phase/frequency detector 120, a loop filter 122, a voltage-controlled oscillator (VCO) circuit 124, a divider 126, an analog-to-digital signal converter (ADC) circuit 128, a digital switch 130, and an analog multiplexer (MUX) 132. It will be understood that in some embodiments, one or more of the components shown in FIG. 1 can be omitted or included as part of a separate system or device, as will be apparent in view of this disclosure. The system 100 takes, as an input, a reference input 102 and produces an analog VCO output 108. The reference input 102 and the VCO output 108 are oscillating electronic signals, such as a sine wave or a square wave. The oscillation phase and frequency of the VCO 124 is a function of the reference input 102. When the VCO 124 is used in a phase locked loop (PLL) control system, the VCO output 108 is related to the phase of the reference input 102 via a loop through the phase/frequency detector 120, the loop filter 122, and the VCO 124. In this example, the phase/frequency detector 120 compares the phase and frequency of the VCO output 108 with the phase and frequency of the reference input 102 and adjusts the VCO 124 to keep the phases and frequencies of the reference input 102 and the VCO output 108 closely in lock step. In some embodiments, the phase/frequency detector 120, the loop filter 122, the VCO 124, and the divider 126 include a PLL control system.

In more detail, the phase/frequency detector 120 receives the reference input 102 and the VCO output 108 of the VCO 124. The VCO output 108 can be passed through the divider 126, which is optional and is located between the VCO 124 and the phase/frequency detector 120, to make the frequency of the VCO output 108 a rational multiple of the frequency of the reference input 102. The frequency/phase detector 120 compares the reference input 102 to the divided VCO output 110 and produces an error signal 104 which is proportional to the phase difference between the reference input 102 and the divided VCO output 110. When the loop is trying to achieve lock, the error signal 104 of the phase/frequency detector 120 can include high and low frequency components of the reference input 102 and/or the divided VCO output 110. The loop filter 122 includes a low pass filter to pass only the low-frequency component of the error signal 104, removing the high-frequency components, to the VCO 124 so that the loop can obtain lock between the reference input 102 and the VCO output 108. The output of the loop filter 122 is a tuning control voltage 106, which is provided to control a tunable capacitance of the VCO 124. The tuning control voltage 106 is also passed through the ADC 128 to produce a digital tuning control value 112, which is a digital representation of the tuning control voltage 106 of the PLL 101. The digital tuning control value 112 is input to the digital switch 130, such as described in further detail with respect to FIG. 3.

Figure 2:
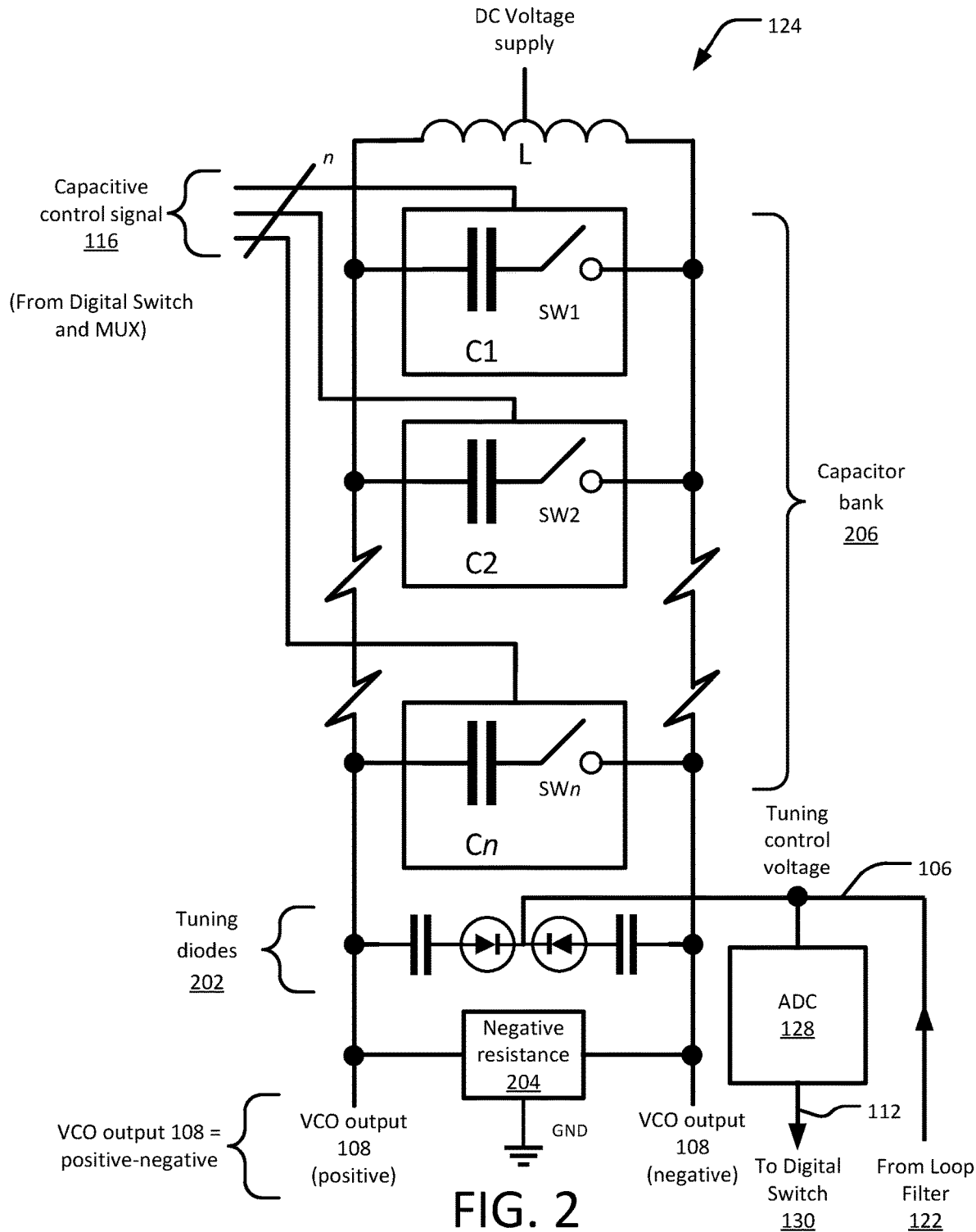
FIG. 2 shows a block diagram of an example VCO, in accordance with an embodiment of the present disclosure.
Figure 3:
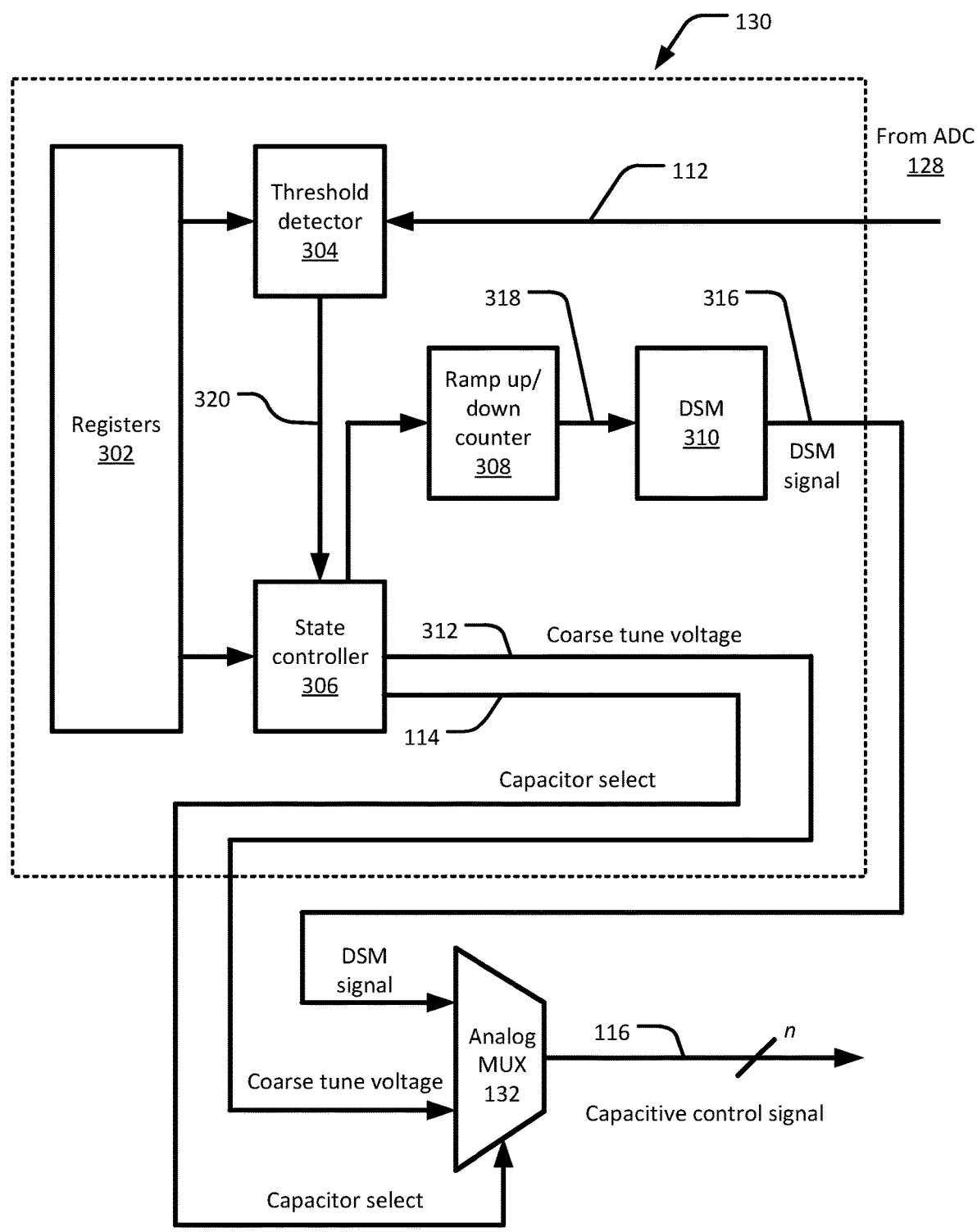
FIG. 3 is a block diagram of an example digital switch and an example multiplexer, in accordance with an embodiment of the present disclosure.

As described in further detail with respect to FIGS. 2 and 3, the VCO 124 includes a capacitor bank configured, in conjunction with an inductor and other elements, to produce multiple overlapping bands covering a range of frequencies. For example, the VCO 124 can produce 14, 15, 16, or any other number of frequency bands. Multiple tuning states allow the VCO 124 to operate at specified frequency over a wide range of frequencies and operating conditions. Each frequency band is digitally selected, or tuned, by enabling (turn on or switch in) or disabling (turn off or switch out) one or more tuning state capacitors in the capacitor bank. For example, when the temperature or other operating condition of the system 100 causes the phase of the range of the current VCO frequency band to change or shift due to temperature or other conditions, the change or shift can be enough to require selection of an adjacent VCO frequency band to maintain phase lock. However, using coarse capacitor selection where the tuning state is abruptly changed from one frequency band to another, the PLL will unlock when the tuning state is changed, thus requiring the system 100 some amount of time to reacquire lock, which can be undesirable.

To this end, the digital switch 130 includes a switching logic and is configured to control, via a MUX select signal, capacitor select 314, the tuning state of the VCO 124 such that phase lock is not lost when the phase of the VCO 124 drifts across a frequency band boundary using both coarse tuning control and fine-tuning control independently on capacitive control signals 116. Coarse tuning control includes a discrete change in the tuning state of the VCO 124, for example, by enabling or disabling a capacitor in the capacitor bank. Fine-tuning, by contrast, is a relatively slow change in the tuning state of the capacitor, for example, by ramping the capacitor tuning voltage up or down in small, intermediate voltage steps between the enabled and disabled states over a longer period of time, such as several microseconds or several milliseconds, than it would otherwise take the tuning capacitor to change states using coarse control. The MUX 132 provides the digital switch 130 with the capability to enable (turn on or switch in) or disable (turn off or switch out) each tuning state capacitor in the capacitor bank in a highly controlled manner. Note that in some example embodiments, the MUX 132 can be replaced by discrete signals to each capacitor in the capacitor bank, which may require the digital switch to use more outputs than needed when implementing the MUX 132 into the system 100.

The digital switch 130 initially begins the process of fine-tuning control by enabling or disabling one of the capacitor's switches at the voltage corresponding to the current tuning state. For example, if a given tuning state capacitor switch is operating at an initial tuning state of 0.0 volts, then the digital switch 130 starts enabling that capacitor switch at 0.0 volts. Likewise, if the tuning state capacitor switch is operating at an initial tuning state of 3.3 volts, then the digital switch 130 starts disabling that capacitor switch at 3.3 volts. The tuning state capacitor is then gradually ramped from the initial voltage to the final voltage in small, intermediate voltage steps while the PLL maintains phase lock. For example, if the initial tuning state of the capacitor switch is 0.0 volts, the digital switch 130 gradually ramps the control voltage of the capacitor switch from 0.0 volts to 3.3 volts over a period of time, which can be several microseconds or several milliseconds. As a result, the new tuning state has more range in the direction of operating condition or temperature.

FIG. 2 shows a block diagram of the example VCO 124, in accordance with an embodiment of the present disclosure. The VCO includes multiple voltage-controlled capacitors (varactors) arranged in an inductive-capacitive (LC) circuit that can be controlled to vary the frequency of the VCO output 108 in response to changes in the tuning voltage 106. The VCO 124 includes an inductor L, n tuning state capacitors C1, C2, Cn, tuning diodes 202, and a negative resistance 204. The inductor L, the capacitors C1, C2, Cn, the diodes 202, and the negative resistance 204 are arranged in parallel. The capacitors C1, C2, Cn form a capacitor bank 206 that is controlled by the digital switch 130 via the MUX 132 using a capacitive control signal 116. Each capacitor C1, C2, Cn is in series with a switch SW1, SW2, SWn. The switches SW1, SW2, SWn enable or disable the corresponding capacitors C1, C2, Cn, and are controlled by the capacitive control signal 116 received from the digital switch 130 via the MUX 116, such as described with respect to FIG. 3. The VCO output 108, including phase and frequency, at the tuning diodes 202 is a function of the number of capacitors C1, C2, Cn that are enabled or disabled, as well as the tuning control voltage 106. The VCO output 108 is the differential signal across the inductor L, where one of the nodes is positive and the other node is negative and the VCO output 108 is the difference between the signal at the positive and negative nodes.

As noted above, the tuning control voltage 106, which is an analog signal, is passed through the ADC 128 to produce a digital tuning control value 112, which is a digital representation of the tuning control voltage 106. The digital tuning control value 112 is input to the digital switch 130, such as described in further detail with respect to FIG. 3. Generally, the tuning control voltage 106 is an input to the VCO 124, which, along with capacitive control signals 116, controls the output frequency of the VCO 124. However, the tuning control voltage 106 has a practical limit to the usable range, which causes a corresponding limit to the output frequency range of the VCO band. Thus, the ADC 128 measures the tuning control voltage 106 to determine whether the operating point and output frequency is near the edge of the VCO band, in which case soft-switching to an adjacent VCO band occurs.

FIG. 3 is a block diagram of an example of the digital switch 130 and the MUX 132, in accordance with an embodiment of the present disclosure. The digital switch 130 includes registers 302, a threshold detector 304, a state controller 306, a ramp up/down counter 308, and a delta-sigma modulator (DSM) 310. The digital switch 130 receives the digital tuning control value 112, which is a digital representation of the tuning control voltage 106 of the PLL 102. The digital switch 130 produces several signals: a coarse tune voltage 312, a capacitor select signal 314, and a DSM signal 316. The MUX 132 receives the coarse tune signal 312, the capacitor select signal 314, and the DSM signal 316. The MUX 132 produces the capacitive control signal 116 based on the coarse tune signal 312, the capacitor select signal 314, and the DSM signal 316. As will be described in further detail with respect to FIG. 4, the state controller 306 is configured to process a state machine sequence for controlling the VCO 124, including controlling the state of the VCO capacitor bank 206 to provide continuous phase lock when the temperature or other conditions of the VCO 124 change during operation.

Example Operations

Figure 4:
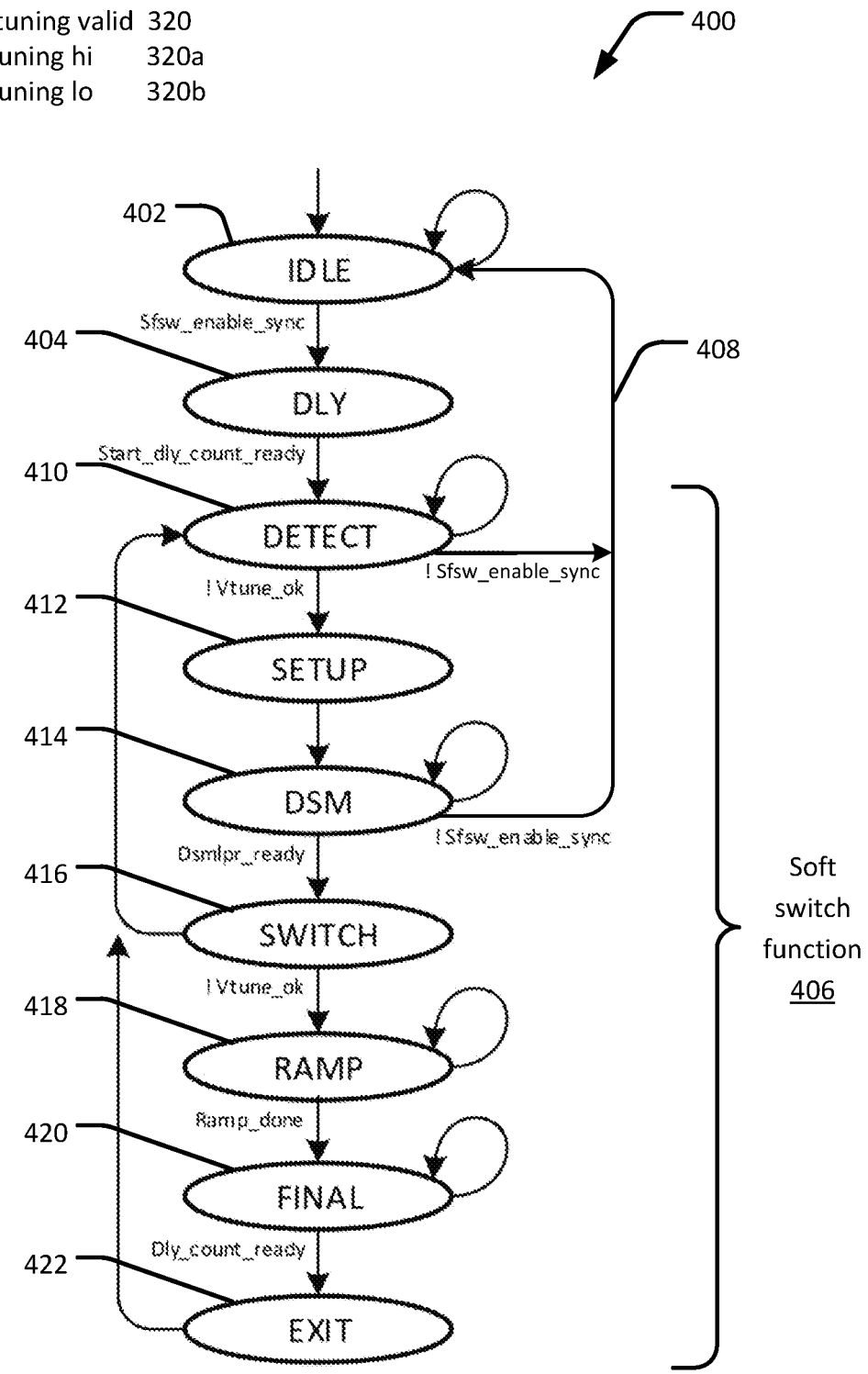
FIG. 4 is a state diagram representing an example state machine sequence of a digital switch, in accordance with an embodiment of the present disclosure.

FIG. 4 is a state diagram representing an example state machine sequence 400 of the digital switch 130, in accordance with an embodiment of the present disclosure. The state controller 306 enters the IDLE state 402 when the state machine sequence is reset or started. In the IDLE state 402, the state controller 306 provides a coarse tune voltage 312 to the MUX 132 and a capacitor select signal 314 to the MUX 132. The capacitor select signal 314 selects the coarse tune voltage 312 as the input to the MUX 132. In turn, the MUX 132 provides the coarse tune voltage 312 to each of the capacitors C1, C2, Cn corresponding to the capacitor select signal 314. The state controller 306 remains in the IDLE state 402 until an active switch enable sync signal (sfsw enable sync) is received, at which time the digital switch 140 enters a DLY (delay) state 404. The switch enable sync signal is synchronized with a switch enable signal and an ADC active signal stored in the registers 302 (the ADC active signal indicates that the ADC 128 is actively providing the digital tuning voltage 112 to the digital switch 130). In the DLY state 404, the state controller 306 runs a counter to wait, for example, $2^{16}$ clock cycles before starting a soft switch function 406. The delay can, for example, be used to give the digital switch 130 time to wait for changes to the registers 302.

The soft switch function 406 includes a sequence of states in the state machine sequence 400 where the digital switch 130 enables or disables one or more capacitors in the capacitor bank 206 of the VCO 124 as the tuning state of the VCO 124 changes due to operating conditions drifting. When the soft switch function 406 is disabled (e.g., via the switch enable signal, as indicated at 408), the state controller 306 enters the IDLE state 402. When soft switch function is enabled via the switch enable signal, the state controller 306 will enter the DLY state 404 before starting the soft switch function 406.

After the clock cycle delay is complete, the state controller 306 enters a DETECT state 410. When the soft switch function 406 is disabled (e.g., via the switch enable signal, as indicated at 408), the state controller 306 enters the IDLE state 402. Otherwise, the state controller 306 remains in the DETECT state 410 until a VCO tuning valid signal (vtune_ok) 320 becomes inactive. The VCO tuning valid signal is asserted while the digital control value 112 is within thresholds monitored by the threshold detector 304. The threshold detector 304 produces mutually exclusive signals VCO tuning valid 320, VCO tuning high 320, and VCO tuning low 320, received by the State controller 306. The VCO tuning valid signal 320 is negated when the digital control value 112 is not within the thresholds monitored by the threshold detector 304, such as while the output voltage 108 is too high to too low for the current tuning state of the VCO 124. The digital switch 130 keeps the capacitive control signal enables or disables constant for all capacitors in the capacitor bank 206 while the tuning valid signal is asserted as part of the soft switch function 406.

Figure 5:
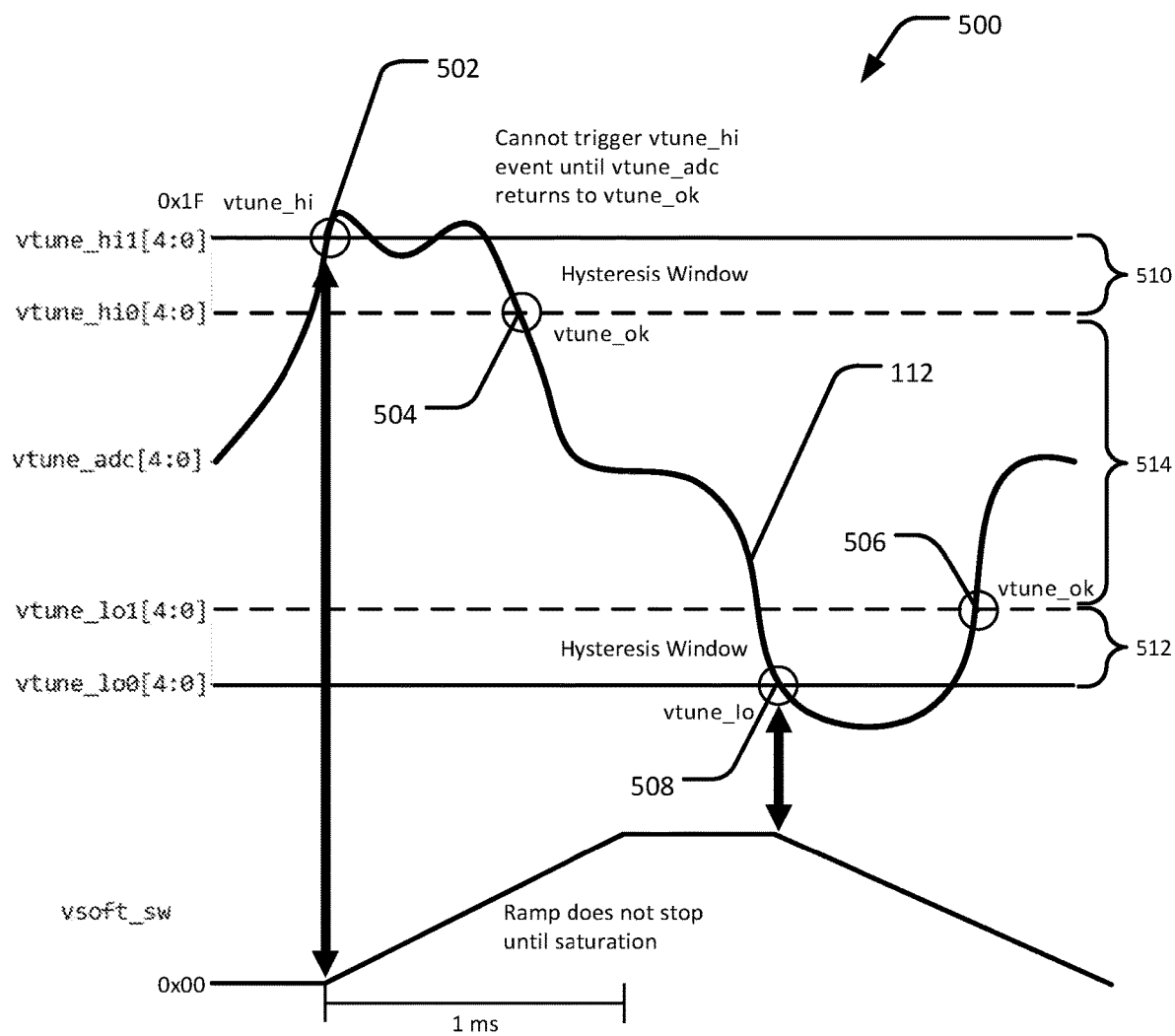
FIG. 5 is a graph representing an example operation of a threshold detector, in accordance with an embodiment of the present disclosure.

FIG. 5 is a graph 500 representing an example operation of the threshold detector 304, in accordance with an embodiment of the present disclosure. The horizontal axis of the graph represents time and the vertical axis of the graph represents digital value. An example of the digital control value 112 is indicated by the curve on the graph. It will be understood that in operation the digital control value 112 can have any shape and that the example in FIG. 5 is provided to demonstrate the operation of the threshold detector 304.

The threshold detector 304 monitors the digital control value 112 from the PLL 101. This monitoring can occur, for example, during the DETECT state 410 of FIG. 4. In an example, the digital control value 112 is a 4-bit ADC signal representing the magnitude of the tuning control voltage 106 of the PLL 101. The threshold detector 304 is configured to have two high thresholds and two low thresholds, which are programmable digital values representing voltage levels and are stored in the registers 302. The two high thresholds include an upper high voltage threshold 502 and a lower high voltage threshold 504. The two low thresholds include an upper low voltage threshold 506 and a lower low voltage threshold 508. Voltages between the upper high voltage threshold 502 and the lower high voltage threshold 504 lie in an upper hysteresis window 510. Likewise, voltages between the upper low voltage threshold and the lower low voltage threshold lie in a lower hysteresis window 512.

When the digital control value 112 from the ADC 128 transitions above the upper high voltage threshold 502, the tuning control voltage 106 is too high and the threshold detector 304 asserts a VCO tuning high signal 320. When the digital control value 112 transitions from above the upper high voltage threshold 502 to below the lower high voltage threshold 504 (completely through the upper hysteresis window 510), the tuning control voltage 106 is in an acceptable range 514 and the threshold detector 304 asserts a VCO tuning valid signal 320. This provides a hysteresis for small voltage fluctuations that may occur after the digital control value 112 crosses the upper high voltage threshold 502. Similarly, when the digital control value 112 transitions below the lower low voltage threshold 408, the tuning control voltage 106 is too low and the threshold detector 304 asserts a VCO tuning low signal 320. When the digital control value 112 transitions from below the lower low voltage threshold 508 to above the upper low voltage threshold 506 (completely through the lower hysteresis window 512), the tuning control voltage 106 is in the acceptable range 514 and the threshold detector 304 asserts a VCO tuning valid signal 320. This provides a hysteresis for small voltage fluctuations that may occur after the digital control value 112 crosses the lower low voltage threshold 508. In operation, the threshold detector 304 asserts only one of the VCO tuning valid 320, the VCO tuning high 320, and the VCO tuning low signals 320 at a time.

Referring again to FIG. 4, when the VCO tuning valid signal 320 is asserted (the digital control value 112 is within thresholds monitored by the threshold detector 304), the digital switch 130 enters a SETUP state 412. In the SETUP state 412, the registers 302 are used to begin the soft switch function 406. The state controller 306 then immediately transitions from SETUP state 412 to DSM state 414. A soft switch override signal (SFSW_override) is asserted indicating the digital switch 130 is taking control of the capacitor bank 206 to enable or disable one or more of the capacitors and change the tuning state of the VCO 124.

When the soft switch function 406 is disabled (e.g., via the switch enable signal, as indicated at 408), the state controller 306 enters the IDLE state 402. Otherwise, the digital switch 130 waits in a DSM state 414 until a DSM low pass filter ready (dsmlpf_ready) signal is asserted. The state controller 306 then transitions to a SWITCH state 416. In the SWITCH state 416, the state controller 306 provides a DSM voltage 316 to the MUX 132 and a capacitor select signal 314 to the MUX 132. The capacitor select signal 314 selects the DSM voltage 316 as the input to the MUX 132. In turn, the MUX 132 provides the DSM voltage 316 to a single capacitors C1, C2, Cn corresponding to the capacitor select signal 314 while the other capacitors remain in the current state defined by coarse tune voltage 312. The DSM low pass filter ready signal indicates that the low pass filtering of the delta sigma modulator (DSM) 312 is at the start value; based on a 16-bit lpf_count value in the registers 302 that counts down from a lpf_count start value to 0. This countdown time allows the DSM filter output 316 to settle close to the starting tuning value for the single capacitive control signal 116 to be ramped to a final value on one capacitor while others remain stable. As noted above, the DSM voltage 316 is used to enable or disable a capacitor in the capacitor bank 206 by ramping in response to detecting that the frequency of the output voltage 108 is too high to too low. If the VCO tuning valid signal 320 is still negated in the SWITCH state 416, state flow will transition to the RAMP state 418. If the VCO tuning valid signal 320 is asserted, normal operating region 514 is in effect and state transitions to DETECT state 410.

Figure 6:
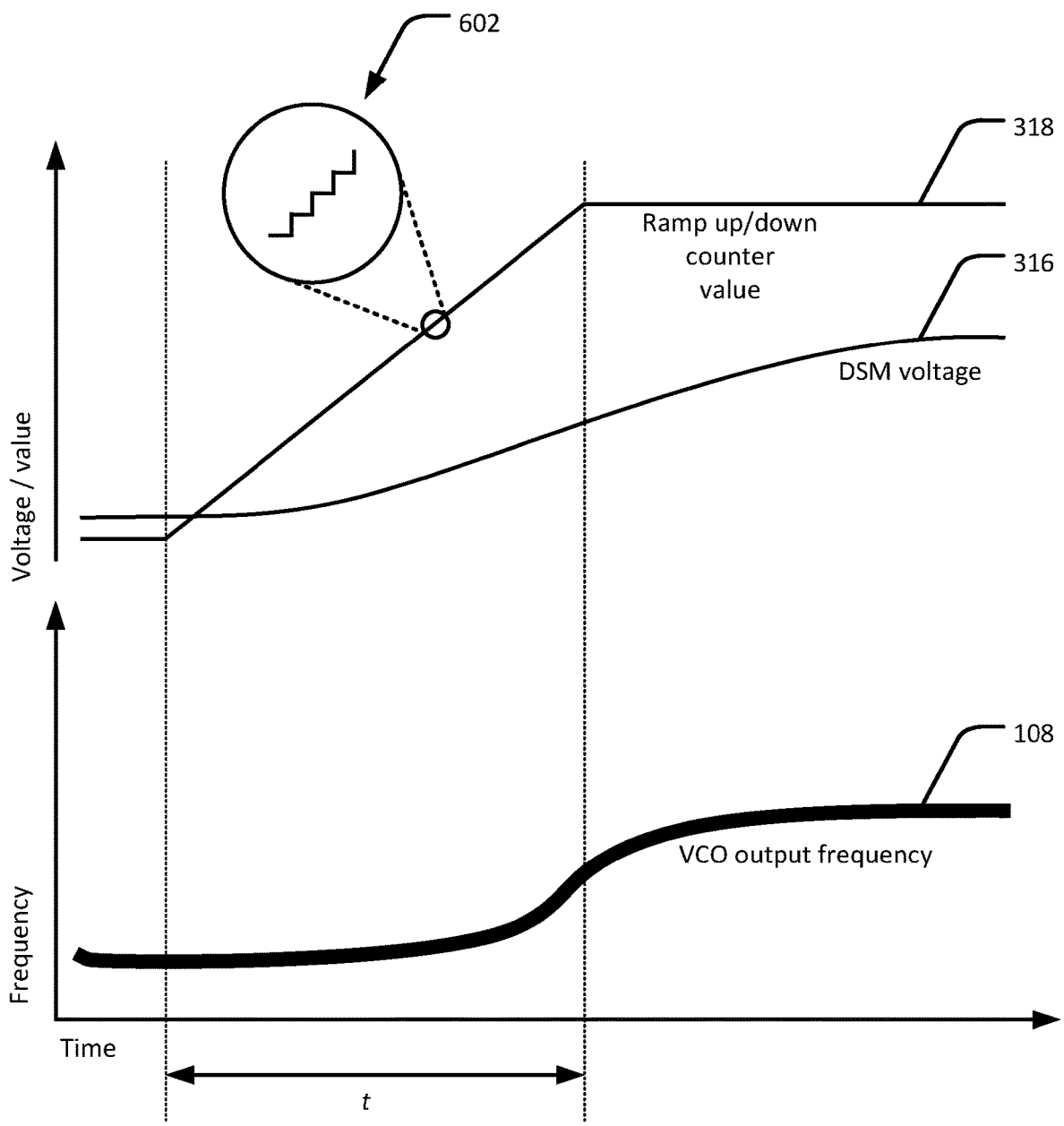
FIG. 6 is a graph of an example operation of a PLL control system, in accordance with an embodiment of the present disclosure.

FIG. 6 is a graph of an example operation of the system 100 while the DSM voltage 316 is used to provide a capacitive control signal 116 to the capacitor in the capacitor bank 206 that is to be enabled by the digital switch 130 in response to detecting that the tuning control voltage 106 is too low, in accordance with an embodiment of the present disclosure. In the RAMP state 418, the state controller 306 causes the ramp up/down counter 308 to gradually increase a ramp up/down counter output 318 over a period of time t. Reference numeral 602 indicates a magnified portion of the ramp up/down counter 318 showing details of a stair step function produced by the ramp up/down counter 308. The time t can be any non-zero value, for example, 2.5 microseconds. The ramp up/down counter 308 represents a sequence of digital value steps 602 provided to the DSM 310, which converts the digital ramp up/down counter 308 into the analog DSM voltage 316 using delta-sigma modulation. The DSM voltage 316 is thus ramped up in small, intermediate voltage steps between tuning states (for example, between 0.0 volts and 3.3 volts in 0.1-volt increments). The DSM voltage 316 is applied to a corresponding one of the capacitors C1, C2, Cn in the capacitor bank 206 to gradually change the state of the corresponding capacitor, which in turn increases the tuning control voltage 106, compensating for operating condition changes, keeping the VCO output 108 as constant as possible, effectively switching the VCO gradually to the next frequency band so as not to lose lock in the PLL, as shown in the bottom portion of FIG. 6.

Figure 7:
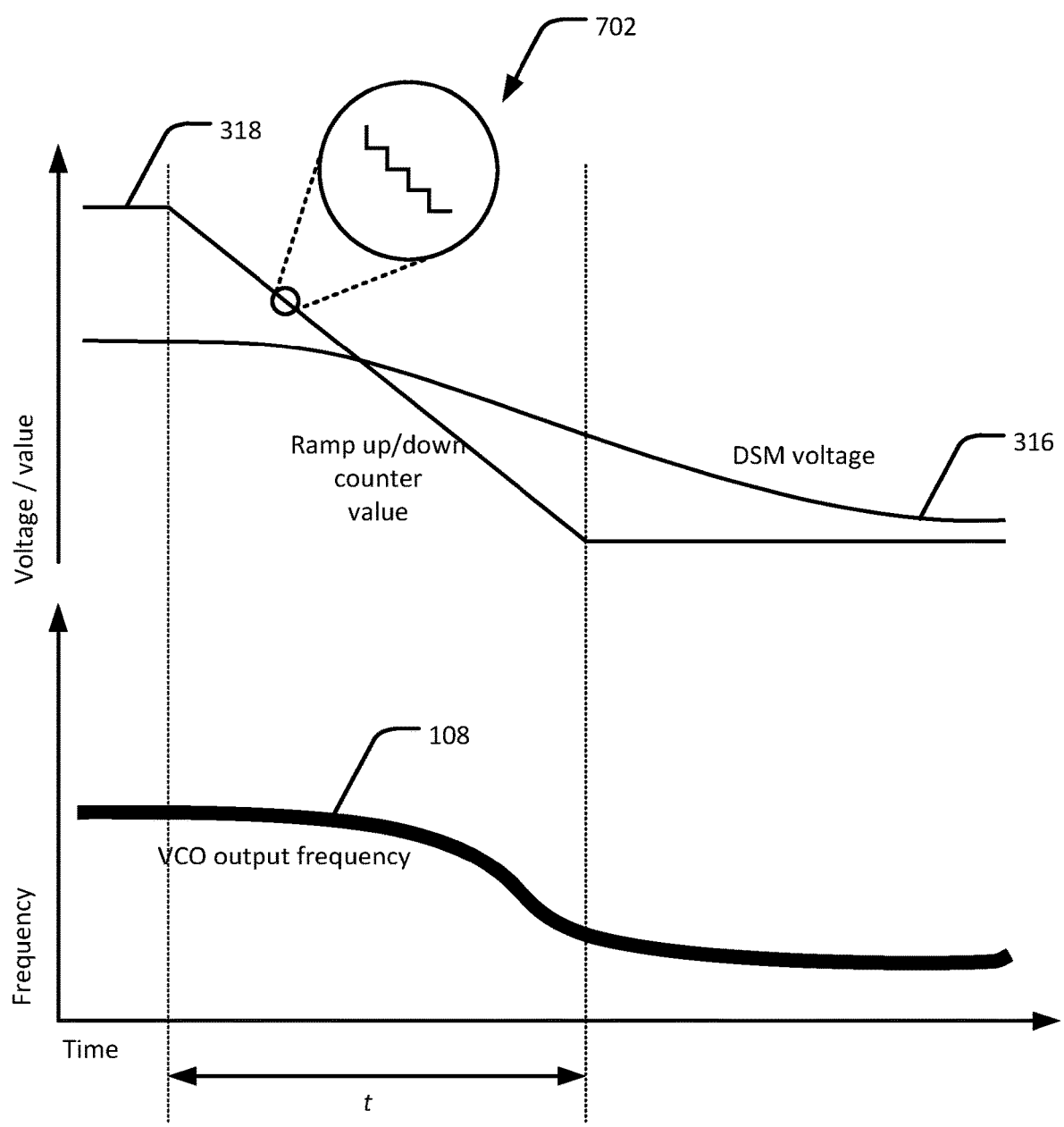
FIG. 7 is a graph of another example operation of the PLL control system, in accordance with an embodiment of the present disclosure.

FIG. 7 is a graph of an example operation of the system 100 while the DSM voltage 316 is used to provide a capacitive control signal 116 to the capacitor in the capacitor bank 206 that is to be disabled by the digital switch 130 in response to detecting that the tuning control voltage 106 is too high, in accordance with an embodiment of the present disclosure. In the RAMP state 418, the state controller 306 causes the ramp up/down counter 308 to gradually decrease a ramp up/down counter 318 over a period of time t. Reference numeral 702 indicates a magnified portion of the ramp up/down counter 318 showing details of a stair step function produced by the ramp up/down counter 308. The time t can be any non-zero value, for example, 2.5 microseconds. The ramp up/down counter 308 represents a sequence of digital value steps 602 provided to the DSM 310, which converts the digital ramp up/down counter 308 into the analog DSM voltage 316 using delta-sigma modulation. The DSM voltage 316 is thus ramped down in small, intermediate voltage steps between tuning states (for example, between 3.3 volts and 0.0 volts in 0.1-volt increments). The DSM voltage 316 is applied to a corresponding one of the capacitors C1, C2, . . . , Cn in the capacitor bank 206 to gradually change the state of the corresponding capacitor, which in turn decreases the tuning control voltage 106, compensating for operating condition changes, keeping the VCO output 108 as constant as possible, effectively switching the VCO gradually to the next frequency band so as not to lose lock in the PLL, as shown in the bottom portion of FIG. 7.

Referring again to FIG. 4, in the RAMP state 418, the digital switch 130 enables or disables one or more of the capacitors in the capacitor bank 206. When the ramp up/down counter completes indicated by active ramp_done, the state controller 306 enters a FINAL state 420. The FINAL state 420 causes a programmable delay to occur allowing the PLL 101 to settle. From the FINAL state 420, the state controller 306 transitions to an EXIT state 422 followed by the DETECT state 410.

Example Methodology

Figure 8:
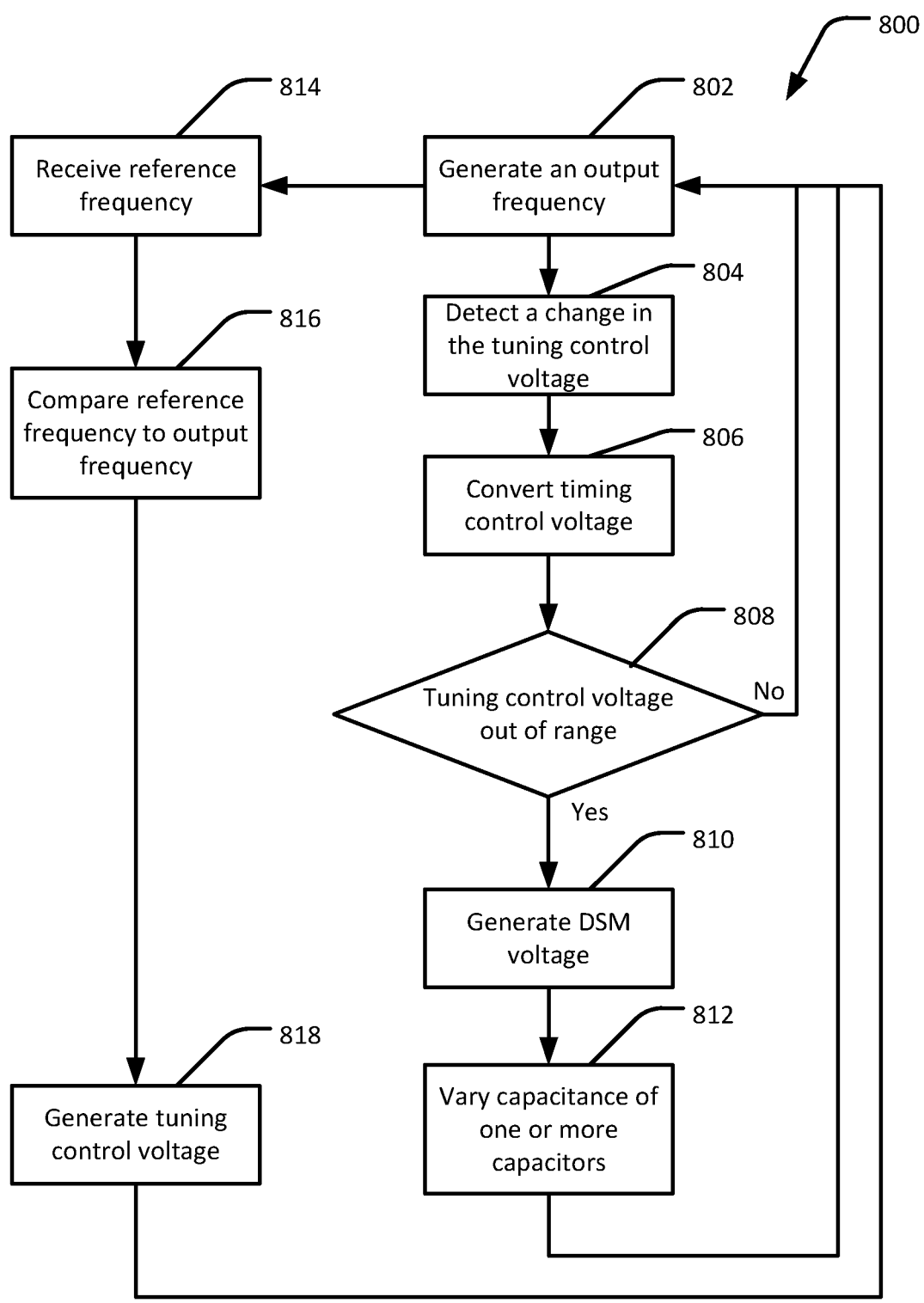
FIG. 8 is a block diagram of an example method of controlling a phase locked loop control system, in accordance with an embodiment of the present disclosure.

FIG. 8 is a block diagram of an example method 800 of controlling a phase locked loop control system, in accordance with an embodiment of the present disclosure. The method 800 can be implemented, for example, by one or more of the components of the system 100 shown in FIGS. 1-3. The method includes generating 802 an output frequency using a voltage-controlled oscillator circuit, such as the VCO 124. The voltage-controlled oscillator circuit includes an inductor and a plurality of capacitors arranged in parallel with the inductor to form a capacitor bank, such as shown in FIG. 2. Each of the capacitors has a switch in series with the respective capacitor, and each switch is controllable by a control signal to enable or disable the respective capacitor in the capacitor bank.

One or more frequency bands of the voltage-controlled oscillator circuit can be selected by enabling or disabling the capacitors. To this end, the method 800 includes detecting 804 a change in the tuning control voltage and enabling or disabling 806 one or more of the capacitors based at least in part on the detected change in the tuning control voltage. The capacitors are enabled or disabled 812 by digitally ramping the control signal between two different voltage levels over a plurality of intermediate voltage steps.

To generate the capacitive control signal, the analog tuning control voltage of the phase/frequency detector circuit is converted 806 into a digital control value. The digital control value is compared 808 to an upper high voltage threshold and a lower low voltage threshold. If the digital control value transitions above the upper high voltage threshold or below the lower low voltage threshold, then a sequence of digital voltage steps (a DSM voltage) is generated 810 using delta-sigma modulation based at least in part on the tuning control voltage of the phase/frequency detector circuit. The digital voltage steps are used to generate 818 a capacitive control signal for the voltage-controlled oscillator circuit, where the voltage-controlled oscillator circuit is configured to generate the output frequency based at least in part on the tuning voltage from the phase/frequency detector and the capacitive control signals from the digital switch, which selects the frequency band of the VCO. The capacitive control signal is provided to the capacitors via a multiplexer operatively connected to the digital switch and to the switch of each capacitor, such as shown in FIGS. 2 and 3. The method 800 further includes enabling or disabling 812 one or more of the capacitors based at least in part on the detected change in the tuning control voltage.

Numerous embodiments will be apparent in light of the present disclosure, and features described herein can be combined in any number of configurations. One example embodiment provides a phase locked loop control system. The phase locked loop control system includes a voltage-controlled oscillator circuit. The voltage-controlled oscillator circuit includes an inductor and a plurality of capacitors arranged in parallel with the inductor, each of the capacitors having a switch in series therewith, each switch being controllable by a capacitive control signal to vary the capacitance of the respective capacitor. The voltage-controlled oscillator circuit is configured to generate a VCO output oscillation frequency based at least in part on a tuning control voltage. The phase locked loop control system further includes a digital switching logic operatively connected to the switch of each capacitor. The digital switching logic is configured to generate the capacitive control signals and to detect a change in the tuning control voltage, enable or disable, via one or more of the capacitive control signals, one or more of the corresponding capacitors based at least in part on the detected change in the tuning control voltage, and ramp the capacitance control signal between two different signal levels over a plurality of intermediate signal steps. In some cases, the system includes a multiplexer operatively connected to the digital switching logic and to the switch of each capacitor. The multiplexer is configured to provide the one or more capacitive control signals to the one or more corresponding capacitors. In some cases, the system includes a phase/frequency detector operatively connected to the voltage-controlled oscillator circuit and configured to receive a reference input and the divided VCO output; compare the reference input to the divided VCO output to produce an error signal which is proportional to a phase difference between the reference input and the divided VCO output; and generate the tuning control voltage for the voltage-controlled oscillator circuit. In such cases, the voltage-controlled oscillator circuit is configured to generate the VCO output based at least in part on the tuning control voltage from the phase/frequency detector and the capacitive control signals from the digital switching logic. In some cases, the system includes an analog-to-digital converter operatively connected to the phase/frequency detector and the digital switching logic. The analog-to-digital converter is configured to convert the tuning control voltage of the filtered phase/frequency detector into a digital tuning control value that is applied to the digital switching logic. In some such cases, the system includes a threshold detector configured to determine when the digital tuning control value transitions above an upper high digital value threshold or below a lower low digital value threshold. In such cases, the digital switching logic is configured to enable or disable one or more of the capacitors when threshold detector determines that the digital tuning control value transitions above the upper high digital value threshold or below the lower low digital value threshold. In some cases, the system includes a delta-sigma modulator (DSM) configured to generate, using delta-sigma modulation, a DSM signal to one or more of the capacitors based at least in part on the tuning control voltage of the phase/frequency detect circuit. In some cases, the system includes a ramp up/down counter configured to generate a digital value to the delta-sigma modulator which provided a pulse density logic stream to a low pass filter which provides the capacitive control signal based at least in part on the tuning control voltage of the phase/frequency detect circuit.

Another example embodiment provides a method of controlling a phase locked loop control system. The method includes generating a VCO output oscillation frequency based at least in part on a tuning control voltage using a voltage-controlled oscillator circuit. The voltage-controlled oscillator circuit includes an inductor and a plurality of capacitors arranged in parallel with the inductor, each of the capacitors having a switch in series therewith, each switch being controllable by a capacitive control signal to enable or disable the respective capacitor. The method further includes detecting a change in the tuning control voltage; enabling or disabling, via one or more of the capacitive control signals, one or more of the corresponding capacitors based at least in part on the detected change in the tuning control voltage; and ramping the capacitive control signal between two different signal levels over a plurality of intermediate signal steps. In some cases, the method includes providing the capacitive control signal to the one or more capacitors using a multiplexer operatively connected to the digital switching logic and to the switch of each capacitor. In some cases, the method includes receiving a reference input and the divided VCO output; comparing the reference input to the divided VCO output to produce an error signal which is proportional to a phase difference between the reference input and the VCO output; and generating the tuning control voltage for the voltage-controlled oscillator circuit, where the voltage-controlled oscillator circuit is configured to generate the VCO output based at least in part on the tuning control voltage from the phase/frequency detector and the capacitive control signal from the digital switching logic. In some cases, the method includes converting the tuning control voltage of the phase/frequency detector into a digital control value. In some such cases, the method includes enabling or disabling one or more of the capacitors when the digital control value transitions above an upper high digital threshold value or below a lower low digital threshold value. In some cases, the method includes generating, using delta-sigma modulation, a DSM signal to one or more of the capacitors based at least in part on the tuning control voltage of the phase/frequency detector. In some cases, the method includes comprising generating a digital level to the delta-sigma modulator which generates a pulse density stream to a low pass filter which generates the capacitive control signal based at least in part on the tuning control voltage of the phase/frequency detector.

Another example embodiment provides a phase locked loop control system. The phase locked loop control system includes a means for generating a phase locked loop VCO output; and a means for changing a tuning state of the means for generating the phase locked loop VCO output. In some cases, the means for changing the tuning state includes a multiplexer configured to provide one or more capacitive control signals to one or more capacitors in the means for generating the phase locked loop VCO output. In some cases, the system includes a means for receiving a reference input and the phase locked loop divided VCO output; comparing the reference input to the divided VCO output to produce an error signal which is proportional to a phase difference between the reference input and the phase locked loop divided VCO output voltage; and generating a tuning control voltage for the means for generating the phase locked loop VCO output, where the means for generating the phase locked loop VCO output is configured to generate the phase locked loop VCO output based at least in part on the tuning control voltage and one or more capacitive control signals to one or more capacitors in the means for generating the phase locked loop VCO output. In some cases, the system includes a means for converting the phase/frequency detector tuning control voltage into a digital control value. In some such cases, the system includes a means for determining when the digital control value transitions above an upper high digital threshold or below a lower low digital threshold, where the means for generating the phase locked loop VCO output is configured to enable or disable one or more capacitors in the means for generating the phase locked loop VCO output when the digital control value transitions above the upper high digital threshold or below the lower low digital threshold. In some cases, the system includes a means for generating, using delta-sigma modulation, a DSM signal and providing the DSM signal to the means for generating the phase locked loop VCO output based at least in part on the phase/frequency detector tuning control voltage.

The foregoing description and drawings of various embodiments are presented by way of example only. These examples are not intended to be exhaustive or to limit the invention to the precise forms disclosed. Alterations, modifications, and variations will be apparent in light of this disclosure and are intended to be within the scope of the invention as set forth in the claims.

What is claimed is:

1. A phase locked loop control system comprising:
   a voltage-controlled oscillator circuit including an inductor and a plurality of capacitors arranged in parallel with the inductor, each of the capacitors having a switch in series therewith, each switch being controllable by a capacitive control signal to vary the capacitance of the respective capacitor, the voltage-controlled oscillator circuit configured to generate a VCO output oscillation frequency based at least in part on a tuning control voltage;
   a digital switching logic operatively connected to the switch of each capacitor, the digital switching logic for generating the capacitive control signals and configured to detect a change in the tuning control voltage, enable or disable, via one or more of the capacitive control signals, one or more of the corresponding capacitors based at least in part on the detected change in the tuning control voltage, and ramp the capacitance control signal between two different signal levels over a plurality of intermediate signal steps; and
   a multiplexer operatively connected to the digital switching logic and to the switch of each capacitor, the multiplexer configured to provide the one or more capacitive control signals to the one or more corresponding capacitors.

2. The system of claim 1, further comprising a phase/frequency detector operatively connected to the voltage-controlled oscillator circuit and configured to
   receive a reference input and the divided VCO output;
   compare the reference input to the divided VCO output to produce an error signal which is proportional to a phase difference between the reference input and the divided VCO output; and
   generate the tuning control voltage for the voltage-controlled oscillator circuit,
   wherein the voltage-controlled oscillator circuit is configured to generate the VCO output based at least in part on the tuning control voltage from the phase/ frequency detector and the capacitive control signals from the digital switching logic.

3. The system of claim 1, further comprising an analog-to-digital converter operatively connected to the phase/frequency detector and the digital switching logic, the analog-to-digital converter configured to convert the tuning control voltage of the filtered phase/frequency detector into a digital tuning control value that is applied to the digital switching logic.

4. The system of claim 3, further comprising a threshold detector configured to determine when the digital tuning control value transitions above an upper high digital value threshold or below a lower low digital value threshold, wherein the digital switching logic is configured to enable or disable one or more of the capacitors when threshold detector determines that the digital tuning control value transitions above the upper high digital value threshold or below the lower low digital value threshold.

5. The system of claim 1, further comprising a delta-sigma modulator (DSM) configured to generate, using delta-sigma modulation, a DSM signal to one or more of the capacitors based at least in part on the tuning control voltage of the phase/frequency detect circuit.

6. The system of claim 5, further comprising a ramp up/down counter configured to generate a digital value to the delta-sigma modulator which provided a pulse density logic stream to a low pass filter which provides the capacitive control signal based at least in part on the tuning control voltage of the phase/frequency detect circuit.

7. A method of controlling a phase locked loop control system, the method comprising:
generating a VCO output oscillation frequency based at least in part on a tuning control voltage using a voltage-controlled oscillator circuit, the voltage-controlled oscillator circuit including an inductor and a plurality of capacitors arranged in parallel with the inductor, each of the capacitors having a switch in series therewith, each switch being controllable by a capacitive control signal to enable or disable the respective capacitor;
detecting a change in the tuning control voltage;
converting the tuning control voltage of a phase/frequency detector into a digital control value;
enabling or disabling, via one or more of the capacitive control signals, one or more of the corresponding capacitors based at least in part on the detected change in the tuning control voltage; and
ramping the capacitive control signal between two different signal levels over a plurality of intermediate signal steps.

8. The method of claim 7, further comprising providing the capacitive control signal to the one or more capacitors using a multiplexer operatively connected to the digital switching logic and to the switch of each capacitor.

9. The method of claim 7, further comprising:
receiving a reference input and the divided VCO output;
comparing the reference input to the divided VCO output to produce an error signal which is proportional to a phase difference between the reference input and the VCO output; and
generating the tuning control voltage for the voltage-controlled oscillator circuit,
wherein the voltage-controlled oscillator circuit is configured to generate the VCO output based at least in part on the tuning control voltage from the phase/frequency detector and the capacitive control signal from the digital switching logic.

10. The method of claim 7, further comprising enabling or disabling one or more of the capacitors when the digital control value transitions above an upper high digital threshold value or below a lower low digital threshold value.

11. The method of claim 7, further comprising generating, using delta-sigma modulation, a DSM signal to one or more of the capacitors based at least in part on the tuning control voltage of the phase/frequency detector.

12. The method of claim 11, further comprising generating a digital level to the delta-sigma modulator which generates a pulse density stream to a low pass filter which generates the capacitive control signal based at least in part on the tuning control voltage of the phase/frequency detector.

13. A phase locked loop control system comprising:
a means for generating a phase locked loop VCO output;
a means for changing a tuning state of the means for generating the phase locked loop VCO output; and
a means for generating, using delta-sigma modulation, a DSM signal and providing the DSM signal to the means for generating the phase locked loop VCO output based at least in part on the phase/frequency detector tuning control voltage.

14. The system of claim 13, wherein the means for changing the tuning state includes a multiplexer configured to provide one or more capacitive control signals to one or more capacitors in the means for generating the phase locked loop VCO output.

15. The system of claim 13, further comprising a means for
receiving a reference input and the phase locked loop divided VCO output;
comparing the reference input to the divided VCO output to produce an error signal which is proportional to a phase difference between the reference input and the phase locked loop divided VCO output voltage; and
generating a tuning control voltage for the means for generating the phase locked loop VCO output,
wherein the means for generating the phase locked loop VCO output is configured to generate the phase locked loop VCO output based at least in part on the tuning control voltage and one or more capacitive control signals to one or more capacitors in the means for generating the phase locked loop VCO output.

16. The system of claim 13, further comprising a means for converting the phase/frequency detector tuning control voltage into a digital control value.

17. The system of claim 16, further comprising a means for determining when the digital control value transitions above an upper high digital threshold or below a lower low digital threshold, wherein the means for generating the phase locked loop VCO output is configured to enable or disable one or more capacitors in the means for generating the phase locked loop VCO output when the digital control value transitions above the upper high digital threshold or below the lower low digital threshold.

* * * * *